United States Patent
Ishii et al.

(10) Patent No.: US 7,598,694 B2
(45) Date of Patent: Oct. 6, 2009

(54) POWER SUPPLY APPARATUS

(75) Inventors: Hideo Ishii, Osaka (JP); Toru Arai, Osaka (JP)

(73) Assignee: Sansha Electric Manufacturing Company Limited, Osaka-shi-, Osaka-fu (JP)

( * ) Notice: Subject to any disclaimer, the term of this patent is extended or adjusted under 35 U.S.C. 154(b) by 408 days.

(21) Appl. No.: 11/712,679

(22) Filed: Feb. 28, 2007

(65) Prior Publication Data

US 2007/0210736 A1 Sep. 13, 2007

(30) Foreign Application Priority Data

Mar. 2, 2006 (JP) ............................... 2006-56205

(51) Int. Cl.
G05B 5/00 (2006.01)
(52) U.S. Cl. .................. 318/471; 318/473; 318/432
(58) Field of Classification Search ................ 318/471, 318/473, 599, 255, 280, 268, 432, 67, 68, 318/69, 66, 439; 388/804, 811, 815; 363/141
See application file for complete search history.

(56) References Cited

U.S. PATENT DOCUMENTS 6,278,080 B1 * 8/2001 Moriguchi et al. ....... 219/130.1

* cited by examiner

Primary Examiner—Karen Masih
(74) Attorney, Agent, or Firm—Duane Morris LLP

(57) ABSTRACT

A power supply unit includes an input-side rectifying circuit (4), an inverter (8) and an output-side rectifying circuit (12), which include power semiconductor devices. The power supply unit is powered during a powering period, and the powering is interrupted during a pausing period. The powering and pausing periods alternate. A fan (18) is driven during each powering period to cool the power semiconductor devices. A temperature detector (30) measures the temperature of the power semiconductor devices and develops a measured-temperature representative signal. A setter (38) produces a reference value, which decreases over the pausing period from the measured-temperature representative signal at the beginning of the pausing period to an intended-temperature representative signal representing the temperature to be attained by the power semiconductor devices at the end of the pausing period. The reference value is prepared from the measured-temperature representative signal at the beginning of the pausing period, the intended-temperature representative signal, and the length of the pausing period. An error amplifier (36) and a fan control unit (22) control the rotation rate of the fan (18) to make the measured-temperature representative signal track the reference value.

3 Claims, 7 Drawing Sheets

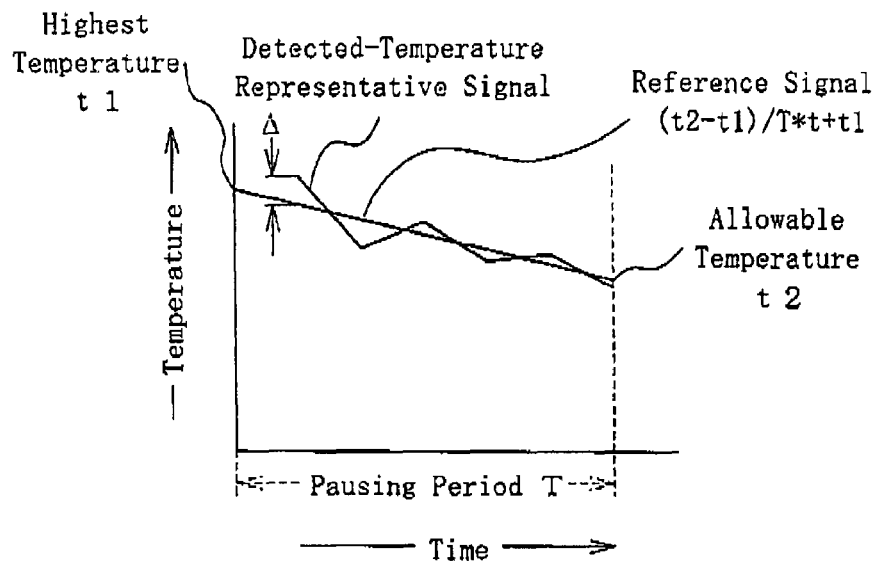
Fig. 2
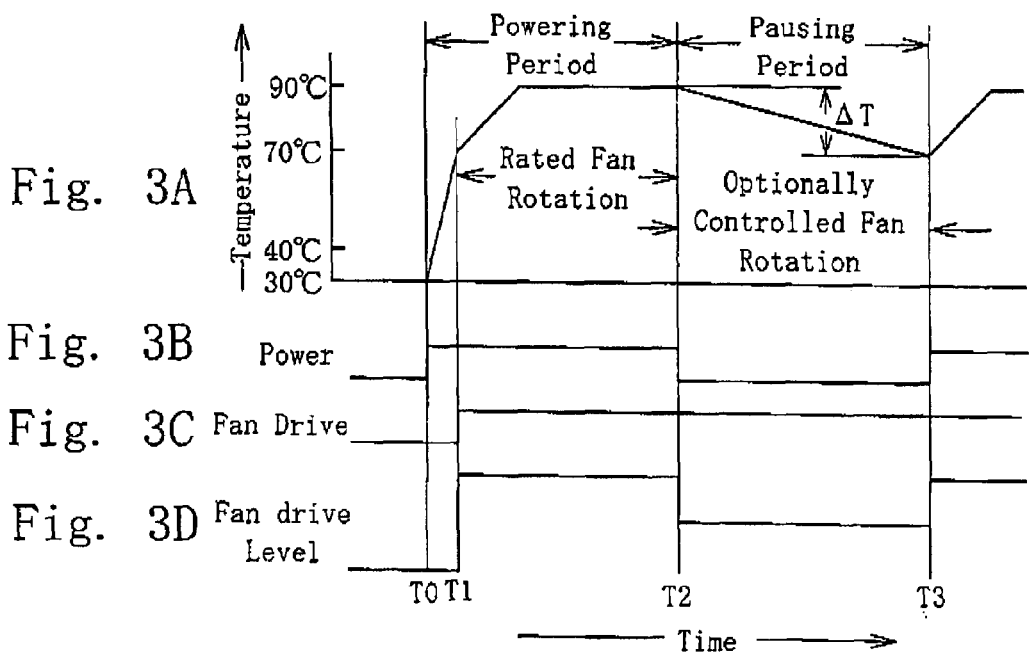
Fig. 3A
Fig. 3B
Fig. 3C
Fig. 3D

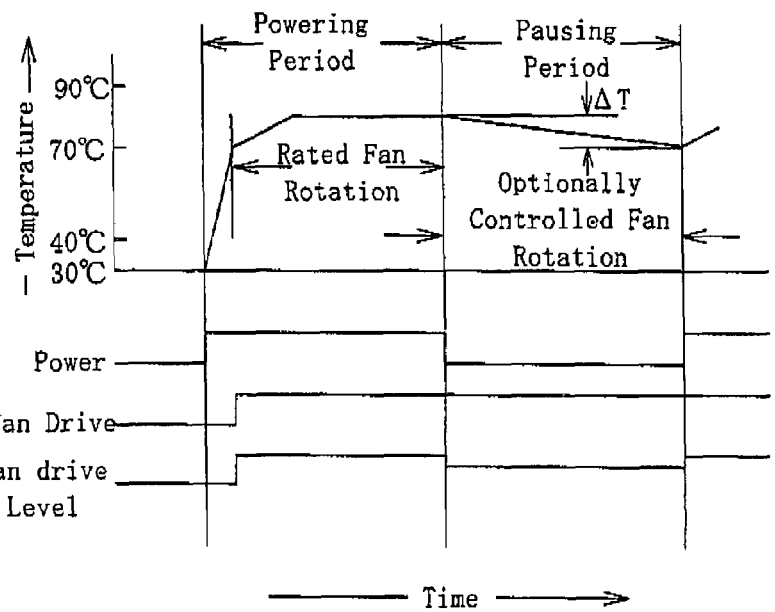
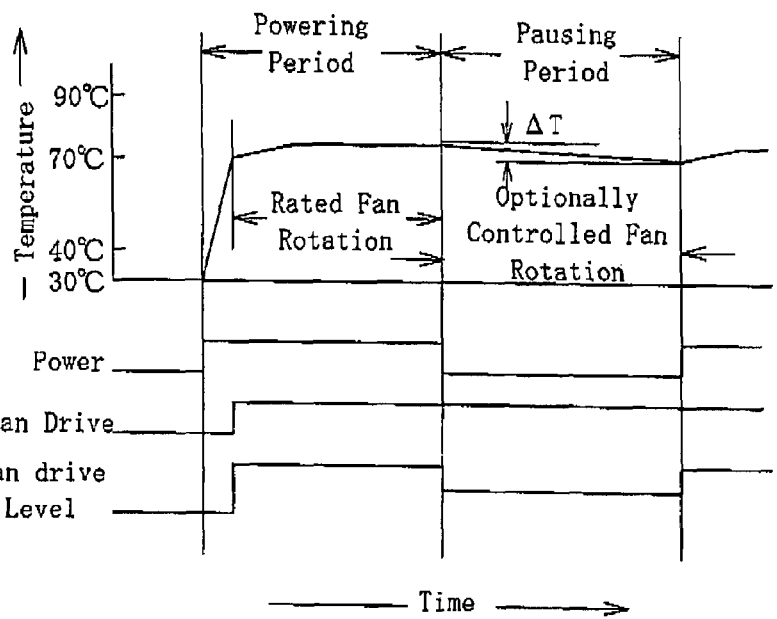

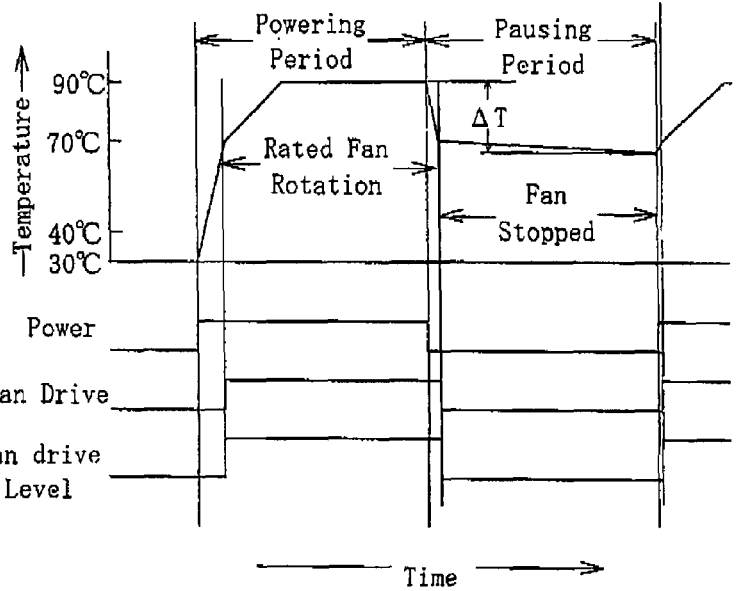
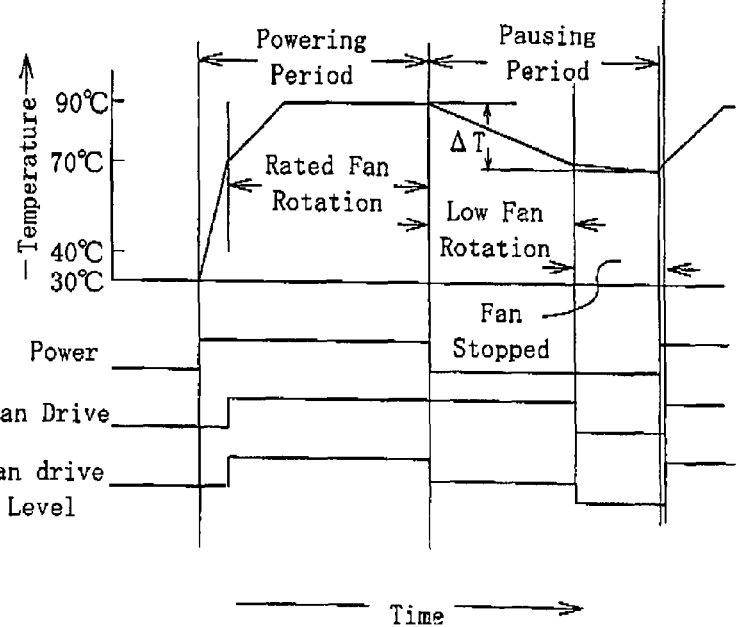

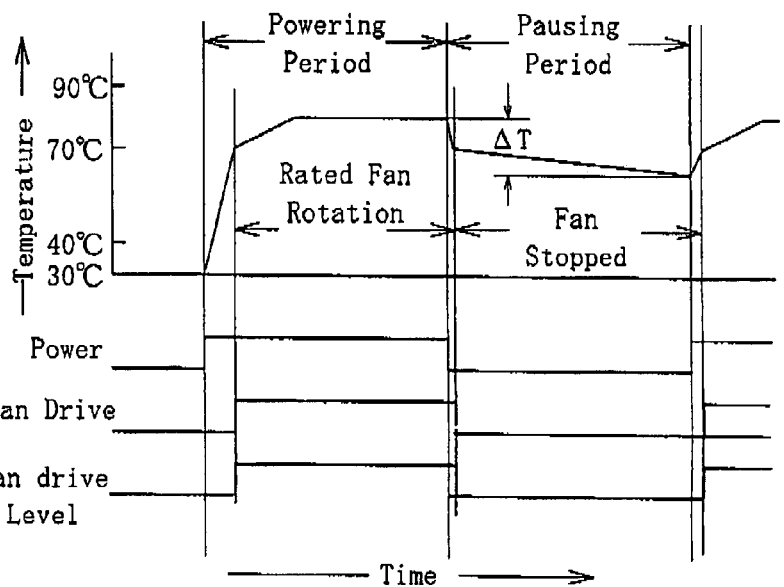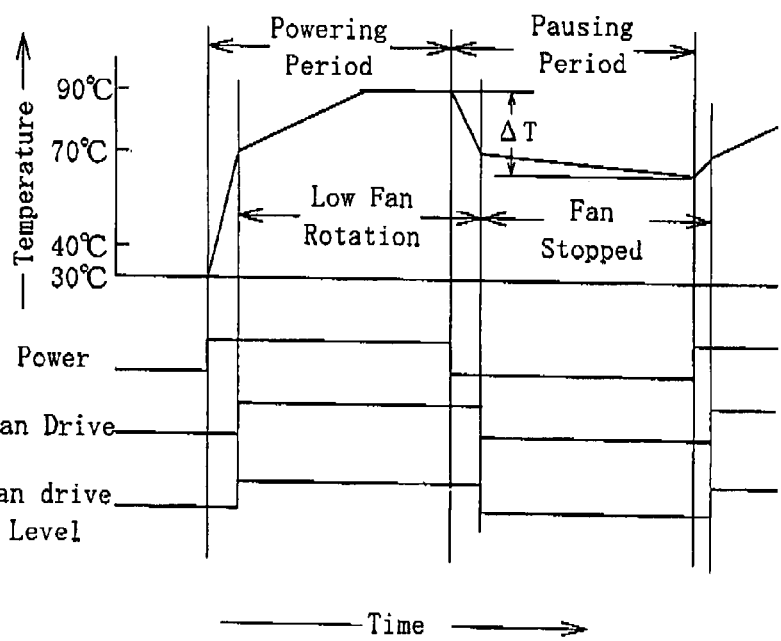

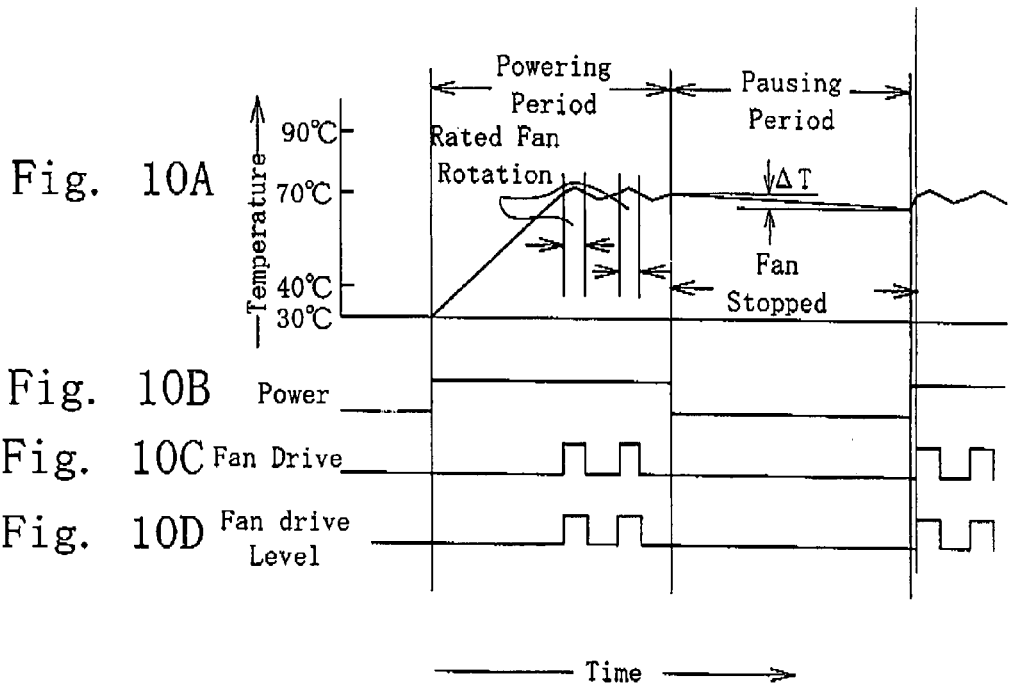
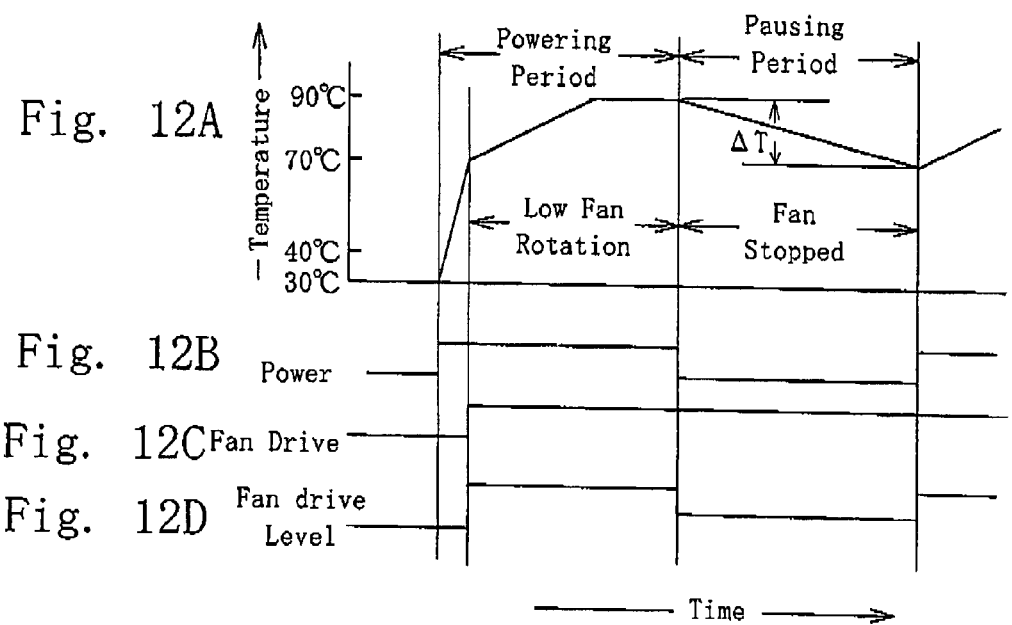

POWER SUPPLY APPARATUS

This invention relates to a power supply apparatus, and, more particularly to a power supply apparatus having its heat generating components cooled by a fan.

BACKGROUND OF THE INVENTION

Power supply apparatuses employ power semiconductor devices, such as diodes, transistors and IGBTs. The life of power semiconductor devices tends to be shorter as the difference between the temperature of the devices when they are operating and the temperature when they are not operating becomes larger. When a power supply apparatus is used with, for example, an arc welder, a cutter, or an electroplating apparatus, it may be subjected to alternation between activation and deactivation at relatively short intervals. Power semiconductor devices of such power supply apparatus are subjected to frequent temperature changes, which further reduces the lives of the semiconductor devices. JP 2000-166217 A proposes a technique for solving this problem, According to JP 2000-166217A, when the power supply apparatus is activated by turning an activation switch on, a fan also starts to be driven to cool the power semiconductor devices to suppress rising of the temperature of the devices. When the activation switch of the power supply apparatus is turned off, the fan is stopped to suppress lowering of the temperature of the power semiconductor devices. This reduces the difference between the temperature of the power semiconductor devices when they are operating and the temperature when they are no operating.

The following problem occurs when the fan is stopped at the same time as the power supply apparatus activation switch is turned off. Specifically, the power semiconductor devices are mounted, in many cases, on a heat sink in the power supply apparatus. If the fan is stopped at the same time as the turning off of the power supply apparatus activation switch, heat will stay and stand in the vicinity of the heat sink, which gives thermal stress to components around the heat sink. To avoid it, the driving of the fan must be continued even after the power supply activating switch is turned off. This, however, causes the temperature of the power semiconductor devices to be lowered too much, and, therefore, the life of the power semiconductor devices cannot be maintained.

An object of the present invention is to provide a power supply apparatus with power semiconductor devices having a life maintained without giving thermal stress to components except for the power semiconductor devices of the power supply apparatus.

SUMMARY OF THE INVENTION

A power supply apparatus according to a first aspect of the present invention has a power supply unit, which employs heat-generating components including a power semiconductor device. The power supply unit includes, for example, a rectifying section for rectifying an AC voltage, a high-frequency converting section for converting the rectified voltage from the rectifying section to a high-frequency voltage, a transformer for voltage-transforming the high-frequency voltage from the high-frequency converting section, and another rectifying section for rectifying the voltage-transformed high-frequency voltage. A fan is used to cool the heat-generating components. The power supply apparatus alternates between a powered state in which power is supplied to the power supply unit for a powering period and a pausing state in which the power to the power supply unit is removed for a pausing period. The powering period may be predetermined, and also the pausing period may be predetermined. The powering period and pausing period can be equal or different. The alternation may be at fixed intervals. The fan is driven during the powering period for cooling the heat-generating components including the power semiconductor devices. The fan may be driven to rotate at its rated rotation rate or at a rotation rate lower than the rated rotation rate. Temperature measuring means measures the temperature of the heat-generating components and develops a measured-temperature representative signal representative of the measured temperature of the heat-generating components. Reference value generating means generates a reference value in accordance with the measured-temperature representative signal at the beginning of the pausing period, an intended-temperature representative signal representing the temperature intended to be reached at the end of the pausing period, and the length of the pausing period. The reference value decreases over the pausing period, from the value corresponding to the measured-temperature representative signal at the beginning of the pausing period to the value corresponding to the intended-temperature representative signal. Control means controls the rotation rate of the fan in such a manner that the measured-temperature representative signal substantially tracks the reference value.

During the pausing period, the rotation rate of the fan of the power supply apparatus arranged as described above is controlled in such a manner that the temperature of the power semiconductor device at the beginning of the pausing period can decrease to the intended temperature at the end of the pausing period. Thus, at the end of the pausing period, the temperature of the power semiconductor device can be the intended temperature. The intended temperature can be properly set so that the difference between the temperature of the power semiconductor device when it is operating and the temperature of the device when it is not operating, can be reduced, which can maintain the life of the power semiconductor device as long as possible. In addition, since the fan is continuously rotating during the pausing period, heat does not stand, which can prevent components around the power semiconductor device from being thermally stressed.

The fan may be rotated at a rated rotation rate or a rate lower than the rated rotation rate during the powered state. When the fan is rotated at a rate lower than the rated rotation rate, it is desirable to control the rotation rate to prevent temperature rising after the semiconductor device attains the intended temperature.

The temperature represented by the measured-temperature representative signal may be the temperature giving thermal stress which components of the power supply apparatus disposed around the power semiconductor device can endure. The power semiconductor device may be mounted on a heat sink, and these power supply apparatus components may be disposed around the power semiconductor device. With this arrangement, it is possible not only to reduce the difference between the temperature of the power semiconductor device when it is operating and the temperature when it is not operating, to thereby maintain the long life of the power semiconductor device, but also to prevent the components around the power semiconductor device from being thermally stressed.

BRIEF DESCRIPTION OF THE DRAWINGS

FIG. 2 is for use in describing a reference signal which is produced by a setter of the power supply apparatus shown in FIG. 1.

FIGS. 3A through 3D are useful in describing operating states of various parts of the power supply apparatus of FIG. 1 to which a rated load is connected.

FIGS. 4A through 4D are useful in describing operating states of various parts of the power supply apparatus of FIG. 1 to which a lower load is connected.

FIGS. 5A through 5D are useful in describing operating states of various parts of the power supply apparatus of FIG. 1 to which a light load is connected.

FIGS. 6A through 6D are useful in describing operating states of various parts of the power supply apparatus with a fan driven to rotate at a rated rotation rate only when the temperature of heat-generating devices including IGBTs rises above an allowable temperature, in which a rated load is connected to the power supply apparatus.

FIGS. 7A through 7D are useful in describing operating states of various parts of the power supply apparatus with a fan driven to rotate at a rated rotation rate when the temperature of heat-generating devices including IGBTs rises above an allowable temperature during the powering period, and driven to rotate at a lower rotation rate during the pausing period until the temperature decreases to the allowable temperature, in which a rated load is connected to the power supply apparatus.

FIGS. 8A through 8D are useful in describing operating states of various parts of the power supply apparatus with a fan driven to rotate at a rated rotation rate only when the temperature of heat-generating devices including IGBTs rises above an allowable temperature, in which a lower load is connected to the power supply apparatus.

FIGS. 9A through 9D are useful in describing operating states of various parts of the power supply apparatus with a fan driven to rotate at a lower rotation rate when the temperature of heat-generating devices including IGBTs rises above an allowable temperature during the powering period, and stopped when the temperature of heat-generating devices including IGBTs decreases below the allowable temperature, in which a lower load is connected to the power supply apparatus.

FIGS. 10A through 10D are useful in describing operating states of various parts of the power supply apparatus with a fan driven to rotate at a rated rotation rate when the temperature of heat-generating devices including IGBTs rises above an allowable temperature during the powering period, and stopped when the temperature of heat-generating devices including IGBTs decreases below the allowable temperature, in which a further lower load is connected to the power supply apparatus.

FIGS. 12A through 12D are useful in describing operating states of various parts of the power supply apparatus of FIG. 11 to which a low load is connected.

THE EMBODIMENT OF THE INVENTION

Figure 1:
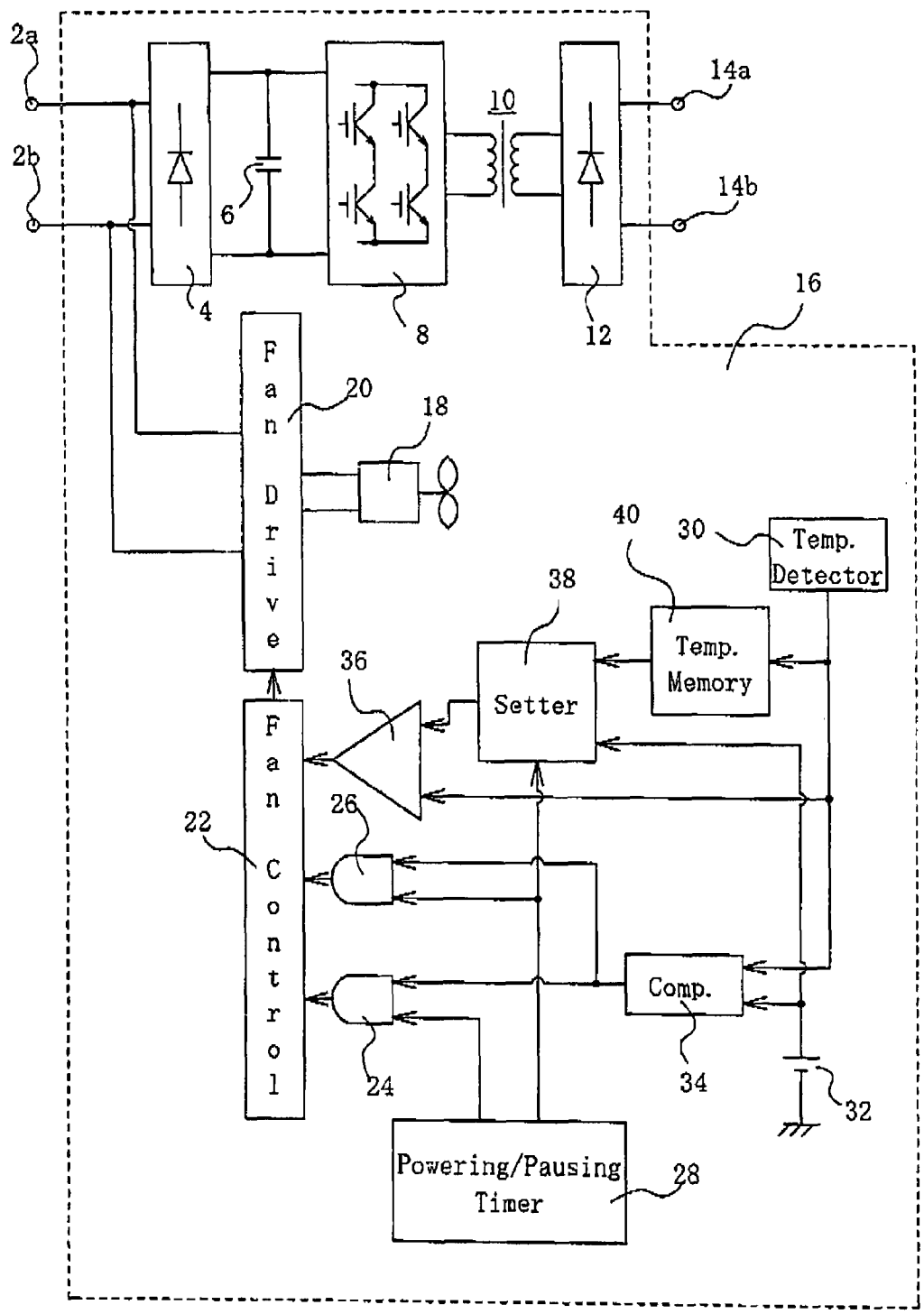
FIG. 1 is a block circuit diagram of a power supply apparatus according to a first embodiment of the present invention.

A power supply apparatus according to a first embodiment of the present invention may be used for an arc welder. As shown in FIG. 1, the power supply apparatus according to the first embodiment has power supply terminals 2a and 2b, through which a commercial AC voltage is supplied to the apparatus. The commercial AC voltage applied to the terminals 2a and 2b is coupled to rectifying means, e.g. an input-side rectifying circuit 4, for rectification. The rectifying circuit 4 includes a plurality of power semiconductor devices, e.g. rectifying diodes, forming a rectifying bridge circuit. The voltage resulting from the rectification is smoothed by smoothing means, e.g. a smoothing capacitor 6, connected in the output of the input-side rectifying circuit 4, into a DC voltage. The resultant DC voltage is converted to a high-frequency voltage by DC-to-high-frequency converting means, e.g. an inverter 8. The inverter 8 is configured as a bridge circuit which is formed by power semiconductor devices, e.g. IGBTs. The high-frequency voltage from the inverter 8 is then transformed to a high-frequency voltage having a predetermined value by a transformer, e.g. an isolation transformer 10. The resulting transformed high-frequency voltage is rectified by high-frequency-to-DC converting means, e.g. an output-side rectifying circuit 12, and the resulting rectified voltage is supplied through output terminals 14a and 14b to a load (not shown). The output-side rectifying circuit 12 also includes power semiconductor devices, e.g. rectifying diodes. Although smoothing means (not shown) is connected in the output of the output-side rectifying circuit 12, no detailed description is given about it since it is irrelevant to the subject of the invention. The input-side rectifying circuit 4, the smoothing capacitor 6, the inverter 8, the transformer 10 and the output-side rectifying circuit 12 form a power supply unit. The power supply unit is housed in a housing 16.

The rectifying diodes of the input-side rectifying circuit 4, the IGBTs of the inverter 8, and the rectifying diodes of the output-side rectifying circuit 12 are mounted on a heat dissipating member, e.g. a heat sink (not shown). The heat generated by these rectifying diodes and IGBTs is radiated from the heat sink. A fan 18 is disposed within the housing 16 in order to air-cool the heat sink, so that the described heat-generating devices including the IGBTs and the diodes can be cooled. Other components and wiring used for the power supply apparatus are disposed around the heat sink. Since these components and wires are disposed near the heat sink, they tend to be an obstruction to the air flow and, thus, form a pool where heat stays and stands, when the fan 18 is not operated.

The fan 18 is driven by a fan drive unit 20, which drives the fan 18 from the commercial AC power from the power supply terminals 2a and 2b. The rotation rate of the fan 18 is controlled by a fan control unit 22. The fan control unit 22 and the later-mentioned circuits are realized by a CPU, for example, but, for ease of explanation, they are described by means of blocks of the functions performed by the CPU.

When an external command to rotate the fan 18 at the rated rotation rate, i.e. a rated-rotation command, is given, the fan control unit 22 commands the fan drive unit 20 to rotate the fan 18 at the rated rate. The power supply apparatus is so designed that, when the fan 18 is rotated at the rated rate, with a rated load connected to the power supply unit and with the power supply unit being powered, the temperature of the power semiconductor devices rises to a predetermined temperature, e.g. the highest temperature, e.g. 90° C., below which the power semiconductor devices can operate properly.

When an external command to rotate the fan 18 at a controlled rotation rate, i.e. a controlled-rate rotation command, is given to it, the fan control unit 22 supplies the fan drive unit 20 with a fan control signal. Then, the fan 18 is rotated at a rate corresponding to the magnitude of the fan control signal.

The rated-rotation command is given through logic means, e.g. an AND gate, to the fan control unit 22. The controlled-rate rotation command is given through logic means, e.g. an AND gate 26, to the fan control unit 22, The rated-rotation command is given to the fan control unit 22 during the powering state, in which the power supply unit is powered, and the controlled-rotation command is given to the fan control unit 22 during the pausing state, in which the power supply unit is not powered.

As stated previously, the power supply apparatus of the illustrated example is used with a welder, and, accordingly, it has a predetermined duty factor. The powering period, during which the power supply unit is powered, and the pausing period, during which power is not supplied to the power supply unit, are set in accordance with the duty factor. The power supply apparatus alternates between the powering state and the pausing state, with one powering period and one pausing period forming one cycle. In the illustrated embodiment, the lengths of the powering and pausing periods are both fifteen (15) minutes. In order for the rated-rotation command to be supplied to the fan control unit 22 through the AND gate 24 during the powering period in each cycle, timer means, e.g. a powering/pausing timer 28, provides a first state signal, e.g. a powering command signal at, for example, a H level, to the AND gate 24 during the powering period at regular intervals. Similarly, in order for the controlled-rate rotation command to be supplied to the fan control unit 22 through the AND gate 26 during the pausing period in each cycle, the powering/pausing timer 28 provides a first state signal, e.g. a pausing command signal at, for example, a H level, to the AND gate 26 during the pausing period at regular intervals. During the powering period, the AND gate 26 is supplied with a second state signal, i.e. the powering command signal at, for example, a L level, and, during the pausing period, the AND gate 24 is supplied with a second state signal, i.e. the pausing command signal at, for example, a L level.

An open/close switch (not shown) is connected between the power supply terminals 2a and 2b and the input-side rectifying circuit 4, and is supplied with the powering command signal. This open/close switch is closed for a period during which the powering command signal is at the H level, so that the power supply unit is powered, and is opened for a period during which the powering command signal is at the L level, so that the power supply unit is placed in the pausing state.

In order to rotate the fan 18 at the rated rotation rate when the temperature of the heat generating devices including the IGBTs rises above a predetermined temperature, e.g. an allowable temperature, temperature measuring means, e.g. a temperature detector 30, provides a measured-temperature representative signal or detected-temperature representative signal, which is coupled to a comparator 34 where it is compared with an allowable-temperature representative signal from an allowable-temperature setting device 32. When the detected-temperature representative signal exceeds the allowable-temperature representative signal, the comparator 34 develops a signal at a first state, e.g. the H level. This H level signal is coupled to the AND gate 24, which, in turn, couples the rated-rotation command to the fan control unit 22.

The temperature detector 30 is mounted on, for example, the heat sink in order to measure the temperature of the heat generating devices including the IGBTs, and develops the detected-temperature representative signal representing the measured temperature. The temperature detector 30 may be mounted at a location other than on the heat sink. The allowable temperature is a temperature to which the other components (not including the heat generating devices) and wires around the heat sink can be exposed in view of problems caused by thermal stress given to them. The allowable temperature may be, for example, 70° C. The allowable-temperature representative signal represents this allowable temperature.

Similarly, in order to rotate the fan 18 at a controlled rotation rate when the temperature of the heat generating devices including the IGBTs is above the allowable temperature during the pausing period, the H level signal is applied from the comparator 34 to the AND gate 26, whereby the controlled-rotation command is applied to the fan control unit 22.

In order to achieve controlled rotation of the fan 18 and, particularly optimally controlled rotation of the fan 18, during the pausing period, an error signal is applied to the fan control unit 22 from an error amplifier 36, and the fan control unit 22 supplies the fan drive unit 20 with such a fan control signal as to make the error signal become substantially zero. For that purpose, the error amplifier 36 is supplied with the detected-temperature representative signal from the temperature detector 30, and with a reference signal from a setter 38. The error amplifier 36 produces the error signal which is representative of the difference between the detected-temperature representative signal and the reference signal.

The setter 38 provides the reference signal to the error amplifier 36 from the beginning of the pausing period to the end of the pausing period. The setter 38 is supplied with a highest-temperature representative signal from a highest-temperature memory unit 40, for developing the reference signal. The highest-temperature memory unit 40 is supplied with the detected-temperature representative signal from the temperature detector 30, and holds the largest value of the detected-temperature representative signal. For the reason described later, this largest value is the highest-temperature representative signal representing the temperature at the end of the powering period. Also, the allowable-temperature representative signal from the allowable-temperature setting device 32, and the pausing-period representative signal, representing the length of the pausing period, from the powering/pausing timer 28 are supplied to the setter 38. The setter 38 produces the reference signal, which lasts from the beginning to the end of the pausing period, in accordance with the highest-signal representative signal, the allowable-temperature representative signal, and the pausing-period representative signal. The reference signal is equal to the highest-temperature representative signal at the beginning of the pausing period and gradually decreases to the allowable-temperature representative signal at the end of the pausing period.

For example, the setter 38 performs an arithmetic operation of $$\frac{(t2-t1)t}{T}+t1$$

for the reference signal, which linearly varies as shown in FIG. 2, where $t_1$ represents the highest-temperature representative signal, $t_2$ represents the allowable-temperature representative signal, T represents the length of the pausing period, and t represents the time length from the beginning of the pausing time. For the reference signal expressed by a quadratic equation, the setter 38 performs an arithmetic operation of $$\frac{(t2-t1)t^2}{T^2}+t1.$$

The reference signal may be generated, using other functions, for example, an exponential function $e^t$ with the base being the Napier's number e.

During the pausing period, the error Δ between the reference signal and the detected-temperature representative signal is successively generated by the error amplifier 36 and supplied to the fan control unit 22, which, in turn, generates and supplies the rotation control signal to the fan drive unit 20. Then, the fan drive unit 20 drives the fan 18 at a controlled rotation rate. As a result, the temperature of the heat sink decreases, substantially tracking the reference signal, as indicated by the detected-temperature representative signal in FIG. 2, and becomes substantially equal to the allowable temperature at the end of the pausing period.

The power supply apparatus with the above-described arrangement operates in the following manner. Let it be assumed, for example, that the load connected between the output terminals 14a and 14b is a rated load and that the temperature of the heat sink is, for example, 30° C., which is lower than the allowable temperature. Now, referring to FIGS. 3A-3D, the powering/pausing timer 28 provides the H-level signal to the AND gate 24 at a time T0. At this time, the commercial AC voltage is supplied through the open/close switch circuit (not shown) to the input-side rectifying circuit 4, whereby the powering of the power supply unit starts as shown in FIG. 3B. This causes the temperature of the heat sink to rise from 30° C. as shown in FIG. 3A. When this temperature rises above 70° C. at a time T1, the comparator 34 provides the H-level signal to the AND gate 24, whereby the rated-rotation command is given to the fan control unit 22, and the fan 18 is driven by the fan drive unit 20 as shown in FIG. 3C. As is seen from FIG. 3D, the fan drive level at which the fan drive unit 20 drives the fan 18 is the rated-rotation level, which is constant, and the fan 18 is rotated at the rated rotation rate. The temperature of the heat sink will rise from 70° C. up to a designed temperature of 90° C., but it will not rise any higher and be kept at 90° C.

At a time T2, at which the powering period ends and the pausing period starts, the powering command signal assumes the L level, and the rated-rotation command disappears. At the same time, the H-level pausing command signal is applied to the AND gate 26, and, also, the H-level signal from the comparator 34 is applied to the AND gate 26, so that the controlled-rotation command is applied to the fan control unit 22 through the AND gate 26. At this time point, as is seen from FIG. 3A, the highest-temperature representative signal, corresponding to 90° C., which is the highest temperature of the heat sink at the beginning of the pausing period (i.e. the end of the powering period), is held in the highest-temperature memory unit 40. The highest-temperature representative signal, the allowable-temperature representative signal corresponding to 70° C., and the pausing-period representative signal from the powering/pausing timer 28 are supplied to the setter 38, where the reference signal is developed in the previously described manner and is supplied to the error amplifier 36. This causes the rotation rate of the fan 18 to be controlled, so that the temperature of the heat sink can gradually decrease from the highest temperature to the allowable temperature during the pausing period. It should be noted that, in FIG. 3D, the drive level is shown linear only for the purpose of indicating that the drive level during the pausing period is lower than the one during the powering period, but, in fact, it does vary.

In this example, the difference between the temperatures at the beginning and at the end of the pausing period is about 20° C. The alternation between the powering period and the pausing period causes the temperature difference ΔT, which is about 20° C., to repeat. This temperature difference, however, does not shorten the life of the power semiconductor devices including the IGBTs. Furthermore, the temperature at the end of the pausing period is allowable to the other components (not including the power semiconductor devices) and wires around the heat sink in view of thermal stress thereto, so that no thermal stress can be given to the other components and wires around the heat sink. Also, because the fan 18 is continuously driven during the pausing period, heat does not stay around the heat sink, which further ensures prevention of thermal stress to the components and wires around the heat sink.

When a load smaller than the rated load is connected between the output terminals 14a and 14b, the highest temperature does not reach the designed temperature of 90° C., as is seen from FIG. 4A, and the detected is highest temperature is kept during the powering period. During the pausing period, the temperature decreases over the pausing period, from the highest temperature at the beginning of the pausing period down to the allowable temperature at the end of the pausing period. As a result, the temperature difference ΔT between the temperatures in the powering and pausing periods is smaller than the temperature difference for the rated load, as shown in FIG. 4A, and, therefore, the life of the power semiconductor devices including the IGBTs is not shortened. Also, the fan 18 is continuously driven during the pausing period, no heat stays around the heat sink, and, therefore, the components and wires around the heat sink are not thermally stressed. FIGS. 4B through 4D, although no detailed descriptions about them are given, correspond respectively to FIGS. 3B through 3D.

When the load connected between the output terminals 14a and 14b is smaller than the small load described above with reference to FIGS. 4A through 4D, the highest temperature is lower than the one for the small load, as is seen from FIG. 5A. Accordingly, the temperature difference ΔT, which is the difference between the temperature at the end of the powering period and the temperature at the end of the pausing period, is smaller than the one for the small load described with reference to FIGS. 4A through 4D, as shown in FIG. 5A, which is advantageous with respect to the life of the power semiconductor devices including the IGBTs. Furthermore, since the fan 18 is continuously driven during the pausing period, heat can be blown off so that it cannot stay in one place, which makes it surer for the other components and wires around the heat sink not to be thermally stressed.

FIGS. 6A through 6D are for explaining operations of parts of the power supply apparatus so arranged that, only when the temperature of the power semiconductor devices including the IGBTs exceeds the allowable temperature, the fan 18 is rotated at the rated rotation rate. In the illustrated example, the load connected to the power supply apparatus is a rated load. In this power supply apparatus, when the temperature of the power semiconductor devices including the IGBTs during the powering period exceeds the allowable temperature of 70° C., the fan 18 is started to rotate at the rated rotation rate. The highest temperature of the power semiconductor devices is the designed temperature of 90° C. When the powering period ends and the pausing period starts, as shown in FIG. 6B, the power semiconductor devices including the IGBTs stop generating heat. Then, the rotation of the fan 18 at the rated rotation rate causes the temperature of the power semiconductor devices including the IGBTs to rapidly decrease to the allowable temperature, and the rated-rate rotation of the fan 18 is stopped as shown in FIG. 6C. During the rest of the pausing period, the power semiconductor devices including the IGBTs are spontaneously cooled. As a result, the temperature decreases below the allowable temperature, as shown in FIG. 6A. Thus, the temperature difference ΔT between the beginning and end of the pausing period is 20-odd ° C. (twenty and odd degrees Celsius). This temperature difference is undesirable in view of retainment of the life of the power semiconductor devices including the IGBTs.

FIGS. 7A through 7D are for explaining operations of parts of the power supply apparatus so arranged that, when the temperature of the power semiconductor devices including the IGBTs exceeds the allowable temperature during the powering period, the fan 18 is rotated at the rated rotation rate, and, when the pausing period starts, the fan 18 is driven at a fixed, low rotation rate until the allowable temperature is reached. The load connected to the power supply apparatus is a rated load. As is understood from FIG. 7B, the power supply unit is powered during the powering period, but it is not powered during the pausing period. As shown in FIG. 7C, the fan 18 is continuously driven from the time when the temperature of the power semiconductor devices exceeds the allowable temperature. As is understood from FIG. 7A, the rated-rate rotation of the fan ends when the powering period ends, and, thereafter, the fan 18 is rotated at the low rotation rate until the temperature of the power semiconductor devices including the IGBTs decreases below the allowable temperature. The drive level of the fan during the powering period and the one during the pausing period differ from each other, as shown in FIG. 7D. In this case, too, the temperature of the power semiconductor devices including the IGBTs reaches the allowable temperature before the end of the pausing period, and the power semiconductor devices including the IGBTs are spontaneously cooled during the rest of the pausing period. Then, as shown in FIG. 7A, the temperature difference ΔT between the beginning and end of the pausing period is 20-odd ° C. (twenty and odd degrees Celsius). This temperature difference is undesirable in view of prolongation of the life of the power semiconductor devices including the IGBTs.

FIGS. 8A through 8D are for explaining operations of parts of the power supply apparatus so arranged that, only when the temperature of the power semiconductor devices including the IGBTs exceeds the allowable temperature, the fan 18 is rotated at the rated rotation rate. In the example shown in FIGS. 8A through 8D, the load connected to the power supply apparatus is a load lower than the rated load. In this power supply apparatus, when the temperature of the power semiconductor devices including the IGBTs during the powering period exceeds the allowable temperature, the fan 18 is started to rotate at the rated rotation rate. Since the load is lower than the rated load, the temperature of the power semiconductor devices including the IGBTs never exceeds the designed temperature. As the powering period ends and the pausing period begins the power semiconductor devices including the IGBTs stop generating heat. The rated rate rotation of the fan 18 rapidly lowers the temperature of the power semiconductor devices including the IGBTs to the allowable temperature, and when the allowable temperature is reached, the rotation of the fan 18 at the rated rotation rate is stopped as shown in FIG. 8C. During the remainder of the pausing period, the heat-generating devices including the IGBTs are subjected to spontaneous cooling. As a result, the temperature of the power semiconductor devices including the IGBTs is below the allowable temperature at the end of the pausing period, as shown in FIG. 8A, and the difference between the temperature at the beginning of the pausing period and the temperature at the end of the pausing period can be small. FIG. 8D is similar to FIG. 7D.

FIGS. 9A through 9D are for explaining operations of parts of the power supply apparatus so arranged that, when the temperature of the power semiconductor devices including the IGBTs exceeds the allowable temperature during the powering period, the fan 18 is rotated at a low rotation rate, and, when the temperature decreases below the allowable temperature, the fan 18 is stopped. The load connected to the power supply apparatus is lower than the rated load, as in the case of FIGS. 8A-8D. As is understood from FIG. 9A, when the detected temperature during the powering period exceeds the allowable temperature, the lower rate rotation of the fan 18 is started. Accordingly, there is a possibility that the temperature of the heat-generating devices including the IGBTs may rise up to the designed temperature. If the temperature reaches the designed temperature, the rotation of the fan 18 is so controlled that the designed temperature is maintained until the end of the powering period. Accordingly, the highest temperature is the designed temperature. When the powering period ends and the pausing period starts, the heat-generating devices including the IGBTs become not to generate heat. When the fan 18 rotating at the lower rotation rate lowers the temperature of the power semiconductor devices including the IGBTs to the allowable temperature, the fan 18 is stopped as is seen from FIG. 9C. It should be noted that the time required for the allowable temperature to be reached is longer than the time required when the load is low and the fan 18 is rotated at the rated rotation rate. The power semiconductor devices including the IGBTs are subjected to spontaneous cooling during the rest of the pausing period. As a result, the temperature of the power semiconductor devices including the IGBTs decreases below the allowable temperature, as shown in FIG. 9A, and the difference between the temperatures of the power semiconductor devices including the IGBTs at the beginning and end of the pausing period is larger than the one when the low load is connected and the fan 18 is rotated at the rated rotation rate.

FIGS. 10A through 10D are similar to FIGS. 6A through 6D, and are for explaining operations of parts of the power supply apparatus so arranged that, when the temperature of the power semiconductor devices including the IGBTs exceeds the allowable temperature during the powering period, the fan 18 is rotated at the rated rotation rate, and, when the temperature of the power semiconductor devices including the IGBTs lowers below the allowable temperature, the fan 18 is stopped. The load connected to the power supply apparatus is a load further lower than the lower load of the example described with reference FIGS. 9A through 9D. As the temperature of the power semiconductor devices including the IGBTs reaches the allowable temperature, the fan 18 is rotated at the rated rotation rate, as shown in FIG. 10A. Since the load is small, the temperature decreases below the allowable temperature in a relatively short time, and, then, the fan 18 stops. Then, the temperature of the power semiconductor devices including the IGBTs rises above the allowable temperature, again, and, the fan 18 starts to rotate at the rated rate, so that the temperature decreases, again, below the allowable temperature In a short time. This is repeated during the powering period. At the beginning of the pausing period, the temperature of the power semiconductor devices including the IGBTs is below the allowable temperature, and, therefore, the fan 18 continues to be stopped, as is seen from FIGS. 10C and 10D. Accordingly, the temperature difference between the beginning and end of the pausing period is the one due to spontaneous cooling. If the load connected to the power supply apparatus is further smaller than the load being discussed, it never happens for the temperature of the power semiconductor devices including the IGBTs to rise above the allowable temperature, and, therefore, the fan 18 does not rotate at all. In such case, too, the temperature difference between the beginning and end of the pausing period is only due to spontaneous cooling, and is small.

Figure 11:
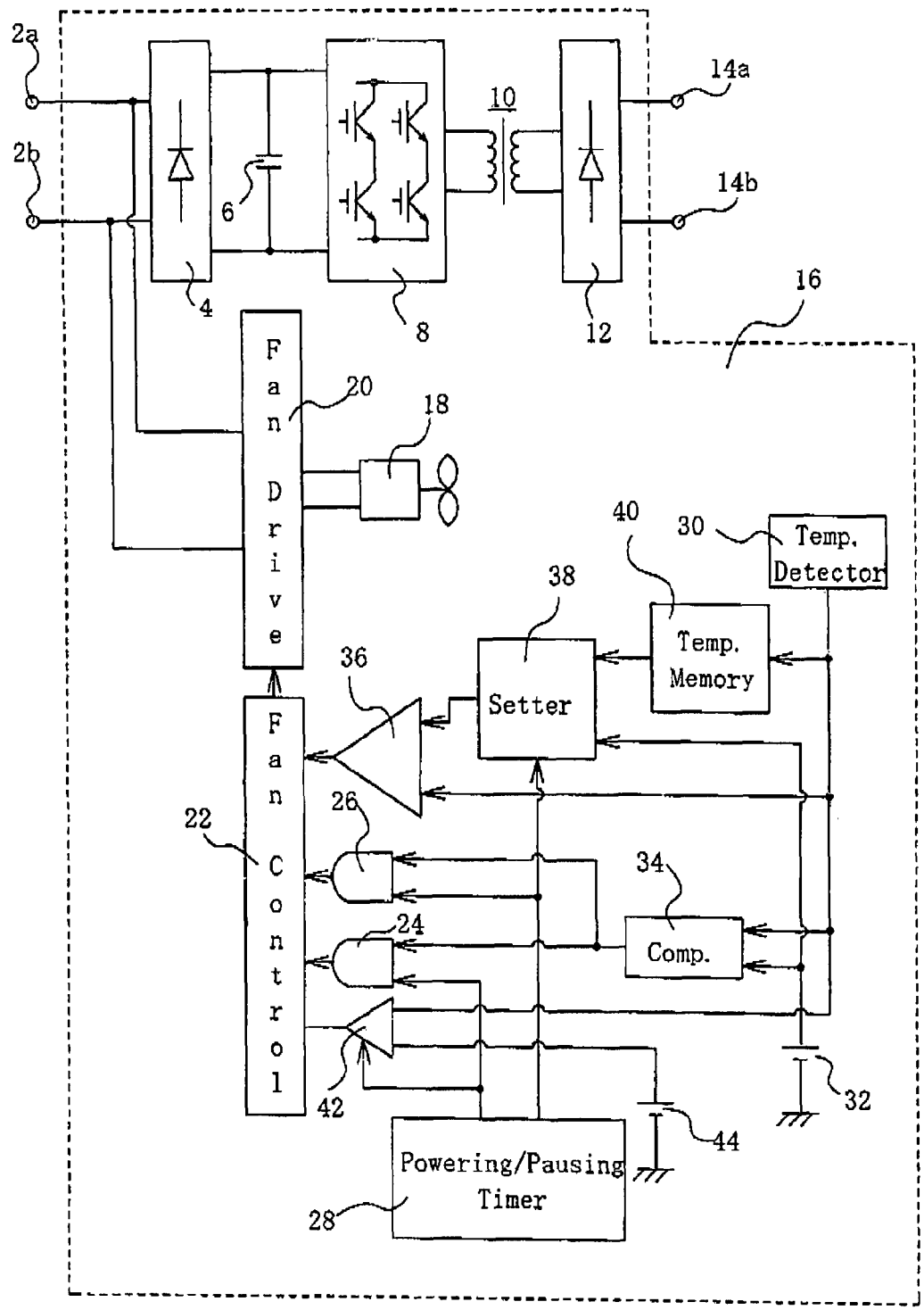
FIG. 11 is a block circuit diagram of a power supply apparatus according to a second embodiment of the present invention.

FIG. 11 is a block circuit diagram of a power supply apparatus according to a second embodiment of the present invention, and FIG. 12A through 12D are illustrating operations at various parts of the power supply apparatus of FIG. 11. This power supply apparatus differs from the power supply apparatus according to the first embodiment in that the rotation rate-of the fan 18 is controlled. The same reference numerals and symbols as used in FIG. 1 are used for the same or similar components and functions of the power supply apparatus in FIG. 11, and no description about them is given.

The detected-temperature representative signal from the temperature detector 30 is also applied to an error amplifier 42. The error amplifier 42 is also supplied with a powering-period highest temperature representative signal representing an allowable temperature during the powering period. The powering-period highest temperature representative signal is provided by a powering-period allowable temperature setting device 44. When the powering command signal at the H level is applied to the error amplifier 42 from the powering/pausing timer 28, the error amplifier 42 calculates the difference between the detected-temperature representative signal and the powering-period highest temperature signal, and supplies the fan control unit 22 with such a control signal as to make the temperature of the power semiconductor devices including the IGBTs become lower than the powering-period highest temperature by controlling the rotation rate of the fan 18.

In this power supply apparatus, when the powering period starts as shown in FIG. 12B and the detected temperature rises up to the allowable temperature as shown in FIG. 12A, the fan 18 rotates at a rotation rate lower than the rated rotation rate. Since the fan 18 rotates at a lower rotation rate, it is possible that the detected temperature may rise up to the designed temperature even if and when the load connected to the power supply apparatus is a low load. In such case, the rotation rate of the fan 18 is controlled in accordance with the control signal from the error amplifier 42, so that the temperature of the power semiconductor devices including the IGBTs can be maintained at the designed temperature until the end of the powering period. Thus, the highest temperature attained by the power semiconductor devices is the designed temperature. As in the first embodiment, the rotation of the fan 18 is optimally controlled from the beginning of the pausing period, and, accordingly, the detected temperature can be the allowable temperature at the end of the pausing period, which is the same effect as the power supply apparatus according to the first embodiment provides when the rated load is connected with the fan driven at the rated rotation rate. Further, if the connected load is small, there is no need for the fan 18 to be driven at the rated rotation rate.

The power supply apparatus has been described as being for use with welders, by way of example, but it may be used with other machines, which are alternately powered and paused, for example, at predetermined intervals, such as arc cutters. The fan control unit 22, the setter 38, the highest-temperature memory unit 40, the comparator 34, the powering/pausing timer 28, the AND gates 24 and 26, the error amplifiers 36 and 42 etc. have been described to be realized in the form of a CPU, but all or part of them may be provided in the form of analog circuits.

What is claimed is:

1. A power supply apparatus comprising:
   a power supply unit having heat-generating components including a power semiconductor device; and
   a fan for cooling said heat-generating components;
   said power supply unit alternately assuming a powering state in which said power supply unit is powered for a predetermined powering period, and a pausing state in which powering of said power supply unit is stopped for a predetermined pausing period, said fan being driven in said powering state;
   wherein said power supply apparatus further comprises:
   temperature measuring means for measuring the temperature of said heat-generating components and developing a measured-temperature representative signal representing the measured temperature;
   reference value generating means producing a reference value based on said measured-temperature representative signal at the beginning of said pausing state, an intended-temperature representative signal representing the temperature intended to be reached at the end of said pausing state, and the length of said pausing period, said reference value decreasing over said pausing period from said measured-temperature representative signal at the beginning of said pausing state to said intended-temperature representative signal; and
   control means for controlling the rotation rate of said fan in such a manner that said measure-temperature representative signal can substantially track said reference value.

2. The power supply apparatus according to claim 1, wherein said fan is rotated at a rotation rate lower than a rated rotation rate of said fan during said powering state.

3. The power supply apparatus according to claim 1, wherein other components of said power supply apparatus are disposed around said power semiconductor device, and said intended-temperature representative signal is a signal representing an allowable temperature at which said other components can endure thermal stress.

* * * * *